(12) United States Patent
Shen et al.

(10) Patent No.: US 9,689,207 B2
(45) Date of Patent: Jun. 27, 2017

(54) SYSTEMS AND METHODS FOR WELLBORE OPTIMIZATION

(75) Inventors: Xinpu Shen, Stafford, TX (US); Mao Bai, Houston, TX (US); William Bradley Standifird, Richmond, TX (US)

(73) Assignee: Landmark Graphics Corporation, Houston, TX (US)

( * ) Notice: Subject to any disclaimer, the term of this patent is extended or adjusted under 35 U.S.C. 154(b) by 723 days.

(21) Appl. No.: 13/805,257

(22) PCT Filed: Jun. 18, 2010

(86) PCT No.: PCT/US2010/039156
§ 371 (c)(1),
(2), (4) Date: Mar. 11, 2013

(87) PCT Pub. No.: WO2011/159307
PCT Pub. Date: Dec. 22, 2011

(65) Prior Publication Data
US 2013/0166263 A1    Jun. 27, 2013

(51) Int. Cl.
| G06G 7/48 | (2006.01) |
| E21B 7/04 | (2006.01) |
| G06F 17/50 | (2006.01) |
| E21B 47/00 | (2012.01) |

(52) U.S. Cl.
CPC ............ *E21B 7/04* (2013.01); *E21B 47/0006* (2013.01); *G06F 17/5009* (2013.01)

(58) Field of Classification Search
None
See application file for complete search history.

(56) References Cited

U.S. PATENT DOCUMENTS

| 6,354,373 | B1 * | 3/2002 | Vercaemer et al. .......... 166/277 |
| 6,612,382 | B2 * | 9/2003 | King ............................... 175/40 |
| 6,782,947 | B2 * | 8/2004 | de Rouffignac et al. ..... 166/245 |
| 7,181,380 | B2 * | 2/2007 | Dusterhoft et al. ............ 703/10 |
| 7,412,368 | B2 * | 8/2008 | Mitchell ......................... 703/10 |
| 7,653,488 | B2 * | 1/2010 | Mese et al. ....................... 702/6 |
| 2006/0074561 | A1 | 4/2006 | Xia et al. |
| 2007/0168133 | A1 | 7/2007 | Bennett et al. |
| 2008/0289875 | A1 * | 11/2008 | Burge et al. .................... 175/40 |
| 2009/0119076 | A1 | 5/2009 | Madatov et al. |

(Continued)

FOREIGN PATENT DOCUMENTS

CN    101392647 A    3/2009

OTHER PUBLICATIONS

Shen, Xinpu, et al. "Trajectory Optimization for Offshore Wells and Numerical Prediction of Casing Failure Due to Production-Induced Compaction." 46th US Rock Mechanics/Geomechanics Symposium. American Rock Mechanics Association, Jun. 24-27, 2012.*

(Continued)

*Primary Examiner* — Omar Fernandez Rivas
*Assistant Examiner* — Nithya J Moll
(74) *Attorney, Agent, or Firm* — Kilpatrick Townsend & Stockton LLP (57) ABSTRACT

Systems and methods for wellbore optimization, which include numerical procedures for selecting an optimal wellbore trajectory and casing strength based on Formation Loading Potential.

18 Claims, 10 Drawing Sheets

(56) References Cited

U.S. PATENT DOCUMENTS

2009/0319243 A1* 12/2009 Suarez-Rivera et al. ....... 703/10

OTHER PUBLICATIONS

Blaine R. Copenheaver; International Search Report & Written Opinion; PCT/US2010/039156; Aug. 17, 2010;b 12 pgs; ISA/US, Alexandria, Virginia.
Omar F. Fernandez; International Preliminary Report on Patentability; PCT/US2010/039156; Mar. 19, 2013; 6 pgs.; IPEA/US, Alexandria, Virginia.
X. Shen, et al.; Trajectory Optimization for Offshore Wells and Numerical Prediction of Casing Failure Due to Production-Induced Compaction; SPE 123856; SPE Offshore Europe Oil & Gas Conference & Exhibition; Sep. 8-11, 2009; 10 pgs; Aberdeen, UK.
Michael S. Bruno; Geomechanical Analysis and Decision Analysis for Mitigating Compaction Related Casing Damage; SPE 71695; Annual Technical Conference & Exhibition; Sep. 30-Oct. 3, 2001; 13 pgs.; New Orleans, LA.
Official Action for Mexican Patent Application No. MX/A/2012/012854; Jun. 26, 2013; 3 pgs.; Mexican Patent Office.
Response to Official Action for Mexican Patent Application No. MX/A/2012/012854; Nov. 12, 2013; 5 pgs.; Uhthoff, Gomez Vega & Uhthoff.
Robert F. Mitchell; Petroleum Engineering Handbook, vol. II, Drilling Engineering; Society of Petroleum Engineers; 2006; 771 pgs.; Richardson, TX.
A.M. Komarov; Second Office Action for Eurasian Patent Application No. 201300032/31; May 28, 2015; 2 pgs.; Eurasian Patent Organization.
Response to Examination Report for Australian Patent Application No. 2010355268; Feb. 11, 2015; 3 pgs.; Pizzey's.
Charles Berko; Examination Report for Australian Patent Application No. 2010355268; Jan. 21, 2015; 5 pgs.; Australian Government—IP Australia.
Bulletin on Formulas and Calculations for Casing, Tubing, Drill Pipe, and Line Pipe Properties; dated Apr. 15, 1999; 60 pages; American Petroleum Institute, Washington, D.C., United States.
Bulletin on Performance Properties of Casing, Tubing, and Drill Pipe; dated Oct. 1999; 62 pages; American Petroleum Institute; Washington, D.C., United States.
N. R.M Orgensteran and J. F. Nixon; One-dimensional Consolidation of Thawing Soils: dated Aug. 20, 1971; 8 pages; Department of Civil Engineering, University of Alberta, Edmonton, Alberta.
Wayne S. Smith, Robert E. Smith and Keshaven Nair; Sample Disturbance and Thaw Consolidation of a Deep Sand Permafrost; 8 pages; Woodward-Lundgren & Associates, Oakland, California, United States and Atlantic Richfield Company, Dallas, Texas, United States.
Muntean, Sorin: First Examination Report; dated May 5, 2016; 6 pages; Patent Application No. 2796911; Canadian Intellectual Property Office; Canada.
Chinese Patent Application No. 201080067517.2, Office Action mailed Jun. 3, 2015, 12 pages (6 pages for the English transaltion and 6 pages for the original document).
Kocabas et al., "A wellbore model for field-scale modeling of asphaltene plugging," Journal of Petroleum Science and Engineering, vol. 26, Aug. 28, 2000, pp. 19-30.
Bickley et al., Designing Wells for Subsidence in the Greater Ekofisk Area, European Petroleum Conference, Nov. 18, 1992, 10 pages.
Bruno, Subsidence-Induced Well Failure, SPE Drilling Engineering, vol. 7, Issue. 2, Jun., 1992, 5 pages.
Dale, A Case History of Reservoir Subsidence and Wellbore Damage Management in the South Belridge Diatomite Field, SPE Production & Facilities, vol. 15, Issue .01, Feb., 2000, 13 pages.
Hilbert et al., Field-Scale and Wellbore Modeling of Compaction-Induced Casing Failures, SPE Drilling & Completion, vol. 14, Issue. 2, Jun., 1999, 10 pages.
Ibekwe et al., Magnolia Casing Design for Compaction, SPE/IADC Drilling Conference, 2003, 11 pages.
Li et al., Compaction, Subsidence, and Associated Casing Damage and Well Failure Assessment for the Gulf of Mexico Shelf Matagorda Island 623 Field, SPE Annual Technical Conference and Exhibition, 2003, 15 pages.
Mitchell, Permafrost Thaw-Subsidence Casing Design, Journal of Petroleum Technology, vol. 30, Issue. 3, Mar. 1978, 6 pages.
Rouffignac, Subsidence and Well Failure in the South Belridge Diatomite Field, SPE Western Regional Meeting, 1995, 16 pages.
Sayers et al., Predicting Reservoir Compaction and Casing Deformation in Deepwater Turbidities using a 3D Mechanical Earth Model, International Oil Conference and Exhibition in Mexico, 2006, 7 pages.
Smith et al., Analysis And Design Of Production Wells Through Thick Permafrost, 8th World Petroleum Congress, 1971, 10 pages.
Weiner, casing Strain Tests of 133/8-in., N-80 Buttress Connections, JPT Forum, Nov., 1976, 3 pages.

* cited by examiner

SYSTEMS AND METHODS FOR WELLBORE OPTIMIZATION

CROSS-REFERENCE TO RELATED APPLICATIONS

The priority of PCT Patent Application No. PCT/US2010/39156, filed on Jun. 18, 2010, is hereby claimed, and the specification thereof is incorporated herein by reference.

STATEMENT REGARDING FEDERALLY SPONSORED RESEARCH

Not applicable.

FIELD OF THE INVENTION

The present invention relates to systems and methods for wellbore optimization. More particularly, the present invention relates to a numerical procedure for selecting an optimal wellbore trajectory and casing grade based on formation loading potential.

BACKGROUND OF THE INVENTION

Trajectory optimization is a foundational aspect of a wellbore design. A deliberately optimized wellbore trajectory enables drilling to be performed under minimum geostress loads and promotes a longer service life for casings. Trajectory optimization is particularly significant to projects in which wellbores are designed with reference to a given platform. Although platform drilling has historically been an offshore consideration, an increasing number of field development designs include multiple wellbores drilled from a single surface location. Consequently, the necessity for trajectory optimization increases with the constraint of a fixed surface location to harvest a geometrically irregular reservoir.

All wells drilled for the purpose of oil/gas production (or injecting materials into underground formations) must be cased with material with sufficient strength and functionality. Casing and tubing strings are the main structural components of a wellbore design. Casing is needed to maintain borehole stability, prevent contamination of water sands, isolate water from producing formations, and control well pressures during drilling, production, and workover operations. Additionally, casing provides locations for the installation of blowout preventers, wellhead equipment, production packers and production tubing. The cost of casing is a major part of the overall well cost, so selection of casing size, grade, connectors, and setting depth is a primary engineering and economic consideration.

The fundamental basis of casing design is that if stresses in the casing pipe wall exceed the yield strength of the casing material, a failure condition exists. Hence, the yield strength is a measure of the maximum allowable stress on the casing pipe. To evaluate the pipe strength under combined loading conditions, the uniaxial yield strength is compared to the yielding condition. Perhaps the most widely accepted yielding criterion is based on the maximum distortion energy theory, which is known as Huber-Hencky-Mises yield condition and is more commonly referred to as "von-Mises stress." Von-Mises stress is not a true stress. It is a theoretical value, which allows a generalized three-dimensional stress state to be compared with a uniaxial failure criterion (the yield strength). In other words, if the von-Mises stress exceeds the yield strength, a plastic yield failure is indicated.

The expression of von-Mises stress is stated as follows:

$$\sigma_{VME} = \frac{1}{\sqrt{2}}\sqrt{(\sigma_z - \sigma_\theta)^2 + (\sigma_\theta - \sigma_r)^2 + (\sigma_r - \sigma_z)^2} \geq Y_p$$

where:
$Y_p$=minimum yield strength
$\sigma_{VME}$=von-Mises stress
$\sigma_z$=axial stress
$\sigma_\theta$=tangential or hoop stress
$\sigma_r$=radial stress.

While it is generally acknowledged that the von-Mises criterion is the most accurate method of representing elastic yield behavior, use of this criterion in tubular design often fails to consider that, for most pipe used in oilfield applications, collapse is frequently an instability failure, which occurs before the computed maximum von-Mises stress reaches the yield strength. Thus, the use of the von-Mises stress criterion is not appropriate. Only in thick-wall pipe does yielding occur before collapse. Additionally, the accuracy of an analysis using the von-Mises criterion is dependent upon the precise representation of the conditions that exist both for the pipe as installed in the well and for the subsequent loads of interest. Often, it is the change in load conditions that is most important in stress analysis. Thus, an accurate knowledge of all temperatures and pressures that occur over the life of the well can be critical to an accurate analysis using the von-Mises criterion.

In the past, attempts to better analyze casing failure using field scale and reservoir scale modeling has been difficult, if not impossible, due to the difficulty in combining the two models. In fact, existing examples of numerical analysis on casing failure were either performed at reservoir scale without direct coupling to behaviors at the field scale, or performed at a much larger scale, which sacrificed much needed modeling resolution.

There is therefore, a need for a method to numerically analyze casing failure both at the field scale and reservoir scale without sacrificing modeling resolution. Further, there is a need to consider additional parameters during the wellbore trajectory optimization process.

SUMMARY OF THE INVENTION

The present invention therefore, meets the above needs and overcomes one or more deficiencies in the prior art by providing systems and methods for wellbore optimization.

In one embodiment, the present invention includes a computer-implemented method for optimization of a wellbore, which comprises: i) calculating a field scale model for multiple well paths in a production field using a computer processor, each well path representing a potential well bore trajectory; ii) calculating a formation loading potential for the field scale model and plotting a distribution of the formation loading potential along each well path; iii) selecting a well path having a lowest peak value of formation loading potential, the selected well path representing an optimal wellbore trajectory for the wellbore; iv) calculating a primary submodel using the selected well path, the primary submodel comprising a wellbore interval containing the peak value of formation loading potential for the selected well path; v) calculating a secondary submodel of the wellbore interval, the secondary submodel comprising a predetermined casing for the wellbore and an elasto-plastic prediction of a casing failure value for the predetermined casing; vi) determining an optimal casing strength for the wellbore; vii) displaying the secondary submodel for a section of graphically reproduced predetermined casing; viii) drilling the wellbore along the selected well-path; and ix) installing casing in the wellbore with the optimal casing strength.

In another embodiment, the present invention includes a non-transitory program carrier device tangibly carrying computer executable instructions for optimization of a wellbore. The instructions are executable to implement: i) calculating a field scale model for multiple well paths in a production field using a computer, each well path representing a potential well bore trajectory; ii) calculating a formation loading potential for the field scale model and plotting a distribution of the formation loading potential along each well path; iii) selecting a well path having a lowest peak value of formation loading potential, the selected well path representing an optimal wellbore trajectory for the wellbore; iv) calculating a primary submodel using the selected well path, the primary submodel comprising a wellbore interval containing the peak value of formation loading potential for the selected well path; v) calculating a secondary submodel of the wellbore interval, the secondary submodel comprising a predetermined casing for the wellbore and an elasto-plastic prediction of a casing failure value for the predetermined casing; vi) determining an optimal casing strength for the wellbore; vii) displaying the secondary submodel for a section of graphically reproduced predetermined casing; viii) drilling the wellbore along the selected well-path; and ix) installing casing in the wellbore with the optimal casing strength.

Additional aspects, advantages and embodiments of the invention will become apparent to those skilled in the art from the following description of the various embodiments and related drawings.

BRIEF DESCRIPTION OF THE DRAWINGS

The present invention is described below with references to the accompanying drawings in which like elements are referenced with like reference numerals, and in which.

DETAILED DESCRIPTION OF THE PREFERRED EMBODIMENTS

The subject matter of the present invention is described with specificity, however, the description itself is not intended to limit the scope of the invention. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied to other industries to achieve similar results.

System Description

The present invention may be implemented through a computer-executable program of instructions, such as program modules, generally referred to as software applications or application programs executed by a computer. The software may include, for example, routines, programs, objects, components, and data structures that perform particular tasks or implement particular abstract data types. The software forms an interface to allow a computer to react according to a source of input. Abaqus™, which is a commercial software application marketed by Dassault Systeme, may be used as an interface application to implement the present invention. The software may also cooperate with other code segments to initiate a variety of tasks in response to data received in conjunction with the source of the received data. The software may be stored and/or carried on any variety of memory media such as CD-ROM, magnetic disk, bubble memory and semiconductor memory (e.g., various types of RAM or ROM). Furthermore, the software and its results may be transmitted over a variety of carrier media such as optical fiber, metallic wire and/or through any of a variety of networks such as the Internet.

Moreover, those skilled in the art will appreciate that the invention may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both Local and remote computer-storage media including memory storage devices. The present invention may therefore, be implemented in connection with various hardware, software or a combination thereof, in a computer system or other processing system.

Figure 1:
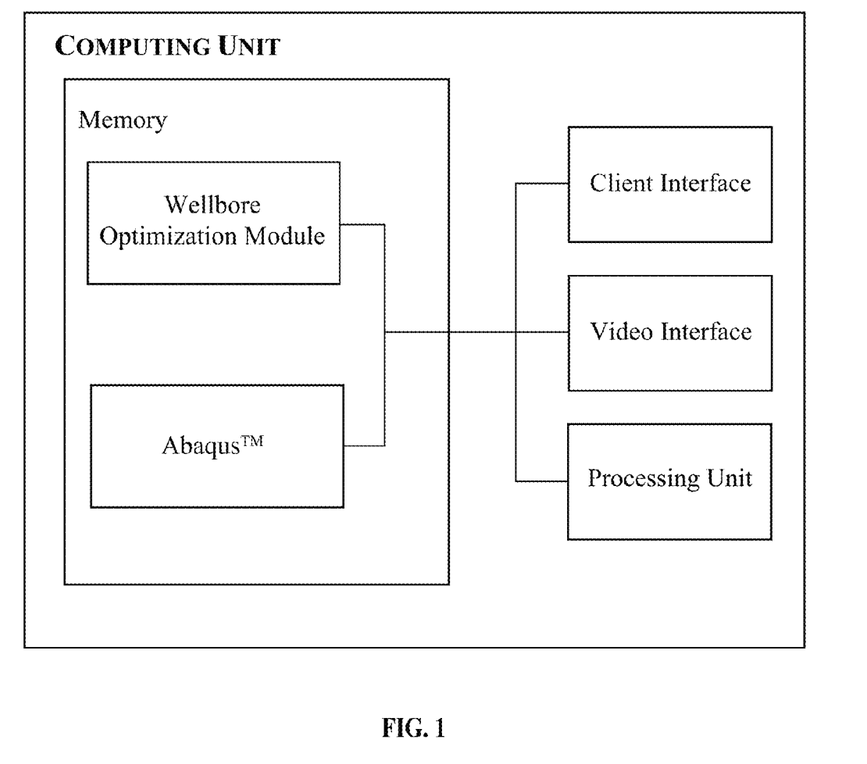
FIG. 1 is a block diagram illustrating one embodiment of a computer system for implementing the present invention.

Referring now to FIG. 1, a block diagram of a system for implementing the present invention on a computer is illustrated. The system includes a computing unit, sometimes referred to a computing system, which contains memory, application programs, a client interface, a video interface and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIGS. 3-18. The memory therefore, primarily includes a wellbore optimization module, which performs steps 304, 306, 316, 318 and 320 illustrated in FIG. 3. Although the Abaqus™ application may be used to interface with the wellbore optimization module to perform steps 302, 304, 308 and 312 in FIG. 3, other interface applications may be used instead of Abaqus™ or the wellbore optimization module may be used as a standalone application.

Although the computing unit is shown as having a generalized memory, the computing unit typically includes a variety of computer readable media. By way of example, and not limitation, computer readable media may comprise computer storage media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/nonremovable, volatile/non-volatile computer storage media or they may be implemented in the computing unit through application program interface ("API"), which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/non-volatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

Method Description

Wellbore trajectory and casing design are influenced by a number of factors and scenarios. However, the present invention is focused on the incremental loading applied to casing due to formation geostress and compaction. This loading represents a loading in addition to the other loads and conditions of conventional casing design and is hereinafter referred to as Formation Loading Potential. By using Formation Loading Potential, it is assumed that the loads from initial geostress of the formations are the primary loads that the casing must accommodate, and that the other loads are of secondary importance. Once a suitable trajectory has been determined, a worst-case assumption (highest possible formation loading the casing can withstand) can be tested by performing a conventional casing analysis.

The following description therefore, demonstrates: i) how to calculate distributions of Formation Loading Potential along candidate well paths; and ii) how to estimate the integrity of casing along the optimal wellbore trajectory.

A key issue is the choice of Formation Loading Potential as an index for indicting possible formation loads on the casing along a wellbore trajectory. An appropriate, well known, plastic potential such as, but not limited to, von Mises type plastic potential and/or Mohr-Coulomb-type plastic potential may be used as the mechanical index to estimate the potential of formation loading on the casing integrity along a wellbore trajectory. The following equation gives an example for von Mises type Formation Loading Potential:

$$F_{Mises} = \frac{1}{\sqrt{2}}\sqrt{(\sigma_1 - \sigma_2)^2 + (\sigma_2 - \sigma_3)^2 + (\sigma_3 - \sigma_1)^2}$$

where $\sigma_i, i=1,2,3$ are the three principal stress components in effective stress space at a given material point.

An example for Mohr-Coulomb type Formation Loading Potential is shown in the following equation as:

$$F_{M-C} = \left[\frac{1}{\sqrt{3}\cos\phi}\sin\left(\theta + \frac{\pi}{3}\right) + \frac{1}{3}\cos\left(\theta + \frac{\pi}{3}\right)\tan\phi\right]q - p\tan\phi$$

where ($\phi$) is the internal frictional angle of formation rock/sand; (q) is the Mises equivalent stress in effective stress space; (p) is the mean effective stress; and ($\theta$) is the deviatoric polar angle of stress point in effective principal stress space corresponding to a given geostress state of formation.

The smaller the Formation Loading Potential along a wellbore trajectory is, the more stable the wellbore will be and, consequently, the load from the formation to the casing will be less. Distributions of Formation Loading Potential along candidate well paths may be plotted to demonstrate the linkage between wellbore trajectory and loads from the formation on the easing.

With the most stable formation environment, this optimized wellbore trajectory will present the least resistance to drilling and ensure that the casing system has minimum loads from the formation and can survive changes in pore pressure and in-situ stress caused by near and far field changes attributable to production. In this manner, the casing will have a longer functional life expectancy along the optimized wellbore trajectory than that along wellbore trajectories that are not optimized using the present invention.

Because of the complex geology and non-uniform distribution of petroleum, casing failure has been a common incident at the Ekofisk field in the North Sea. As a result of the casing failures and the pursuit of a solution, Ekofisk has been investigated by various researchers since the 1970's. The description of the present invention will use Ekofisk as an example, but is not limited in application to use with the Ekofisk field. The nomenclature used herein is described in Table 1 below.

TABLE 1

| | |
|---|---|
| A = | creep model parameter |
| c = | cohesive strength, F/L², Pa |
| E = | Young's modulus, F/L², Pa |
| k = | intrinsic permeability coefficient, Darcy, d |
| m = | creep model parameter |
| n = | creep model parameter |
| R = | initial void ratio |
| t = | total time variable, s |
| $\rho_{elastic}$ = | density of elastic, m/L³, kg/m³ |
| $\rho_{layer-2}$ = | density of layer-2, m/L³, kg/m³ |
| $\rho_{layer-3}$ = | density of layer-2, m/L³, kg/m³ |
| $\rho_{reservoir}$ = | density of layer-2, m/L³, kg/m³ |
| v = | Poisson's ratio |
| $\sigma_s$ = | initial plastic strength, F/L², Pa |
| $\phi$ = | frictional angle, ° |

TABLE 1-continued

| | |
|---|---|
| $\overline{\dot{\epsilon}^{cr}}$ = | equivalent creep strain rate, t⁻¹, s⁻² |
| $\overline{\sigma^{cr}}$ = | von-Mises stress, F/L², Pa |

Figure 2:
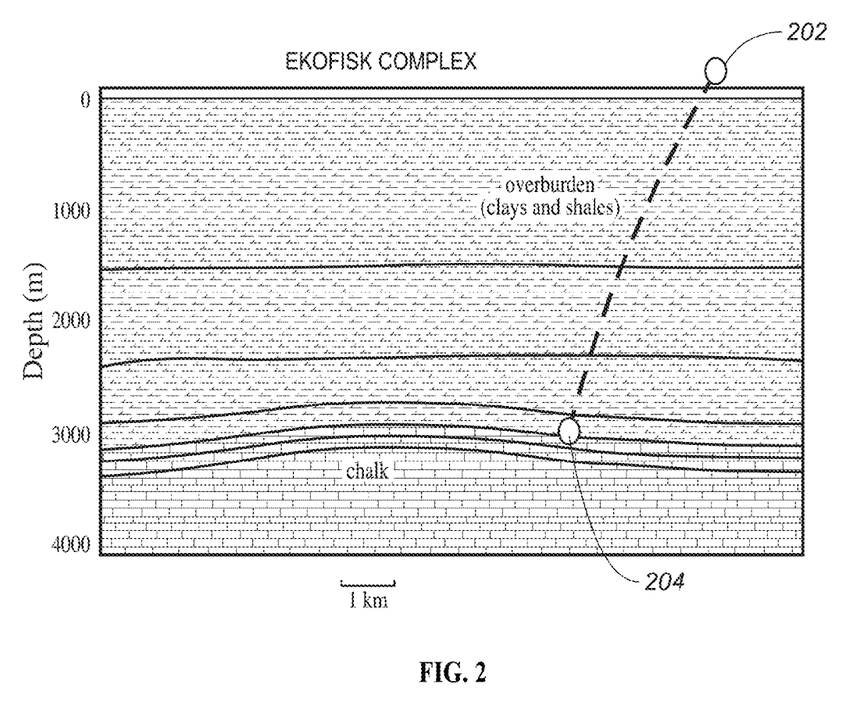
FIG. 2 is a schematic view illustrating the geostructure and wellbore distribution in the Ekofisk field.

Referring now to FIG. 2, the geostructure and wellbore distribution in the area of the Ekofisk field is illustrated. The goal is to select an optimized trajectory for a well path between end points 202 and 204. This optimized well-path trajectory should present the least resistance to drilling and ensure that the casing system can survive changes in pore pressure and in-situ stress caused by near and far field changes attributable to production. Abaqus™ submodeling techniques, which are well known in the art of numerical methods, are utilized to manage the field-to-reservoir scale discrepancy.

The submodeling techniques implemented by the present invention use a large scale global model to produce boundary conditions for a smaller scale submodel. In this way, the hierarchical levels of the submodel are not limited. In this manner, a highly inclusive field scale analysis can be linked to very detailed casing stress analysis at a much smaller scale. The benefits are bidirectional, with both the larger and smaller scale simulations benefiting from the linkage.

Figure 3:
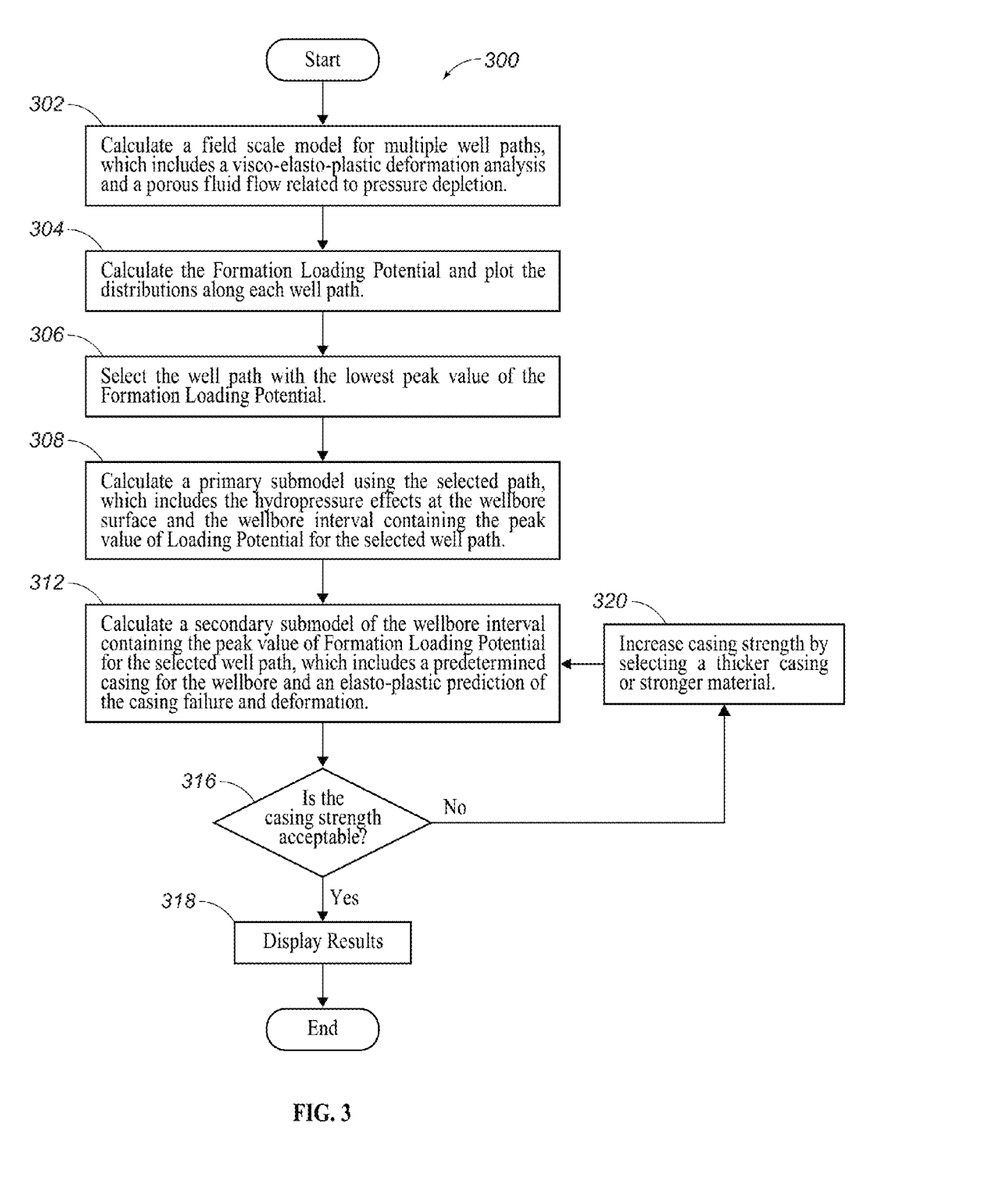
FIG. 3 is a flow diagram illustrating one embodiment of a method for implementing the present invention.

Referring now to FIG. 3, one embodiment of a method 300 for implementing the present invention is illustrated, In step 302, a field scale model is calculated using well known finite element methods for multiple well paths that includes a visco-elasto-plastic deformation analysis and a porous fluid flow related to pressure depletion. The field scale model calculation in step 302 is used to estimate the distribution of Formation Loading Potential and its variation with pressure depletion. This information is then used to select the optimal wellbore trajectory based on the Formation Loading Potential to which the casing will be subjected. In step 302, no actual wellbore exists—only candidate well paths.

Figure 4:
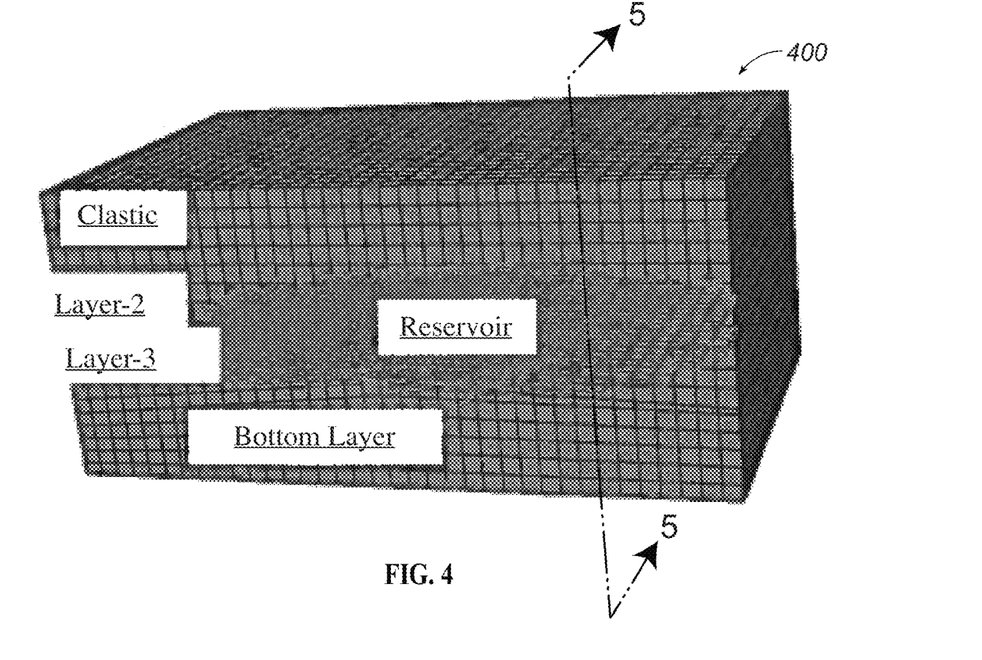
FIG. 4 is a field scale model for the Ekofisk field illustrated in FIG. 2.

One example of a field scale model is illustrated in FIG. 4, which represents an Ekofisk field scale model 400 for the Ekofisk field illustrated in FIG. 2. The field scale model 400 has a total depth of 4000 m, a total width of 5500 m, and a total length of 9000 m. The distribution of the chalk reservoir is shown in red. The model uses four vertical layers of overburden. The thickness of the first (elastic) layer is 1500 m, the second layer is 800 m thick, the thickness of third layer is between 435 and 800 m due to variation of its shape, and the thickness of bottom layer is between 900 and 1265 m. The reservoir layer that ranges from 50 to 150 m is located in the lower middle of layer 3.

As shown in FIG. 2, the horizontal distance between the end points 202 and 204 of two reservoir intersections is approximately 2000 m. This distance suggests that the radial displacement from each wellbore, where you would expect to encounter the effect of pressure depletion, is approximately 1000 m. Consequently, the local pressure depletion around a wellbore is assumed to have a circular area of influence, which is represented in FIG. 4 by the chalk reservoir in red. The horizontal distance between end points 202 and 204 in FIG. 2 is 2100 m. End point 204 is located in the center of the dots in FIG. 5, which represent a pressure depletion area.

The Ekofisk chalk is complex, which creates issues related to visco-plasticity and to compatibility. Furthermore, the chalk elastic modulus varies with pressure in effective stress space. The present invention therefore, adopts the Modified Drucker-Prager yielding criterion, which is well known in the art of geomechanics, to calculate the Ekofisk field scale model 400 illustrated in FIG. 4. Cohesive strength and frictional angle are given the following values:

c=1 MPa
φ=25°

The creep law given in the following equation, which is popular for rock modeling, is adopted:

$$\dot{\bar{\varepsilon}}^{cr} = A(\bar{\sigma}^{cr})^n t^m$$

where $$\dot{\bar{\varepsilon}}^{cr}$$

represents creep strain rate; $\bar{\sigma}^{cr}$ represents von-Mises stress; τ is total time variable; and A, n, m are three model parameters which are given the following values:

A=$10^{-21.8}$
n=2.667
m=−0.2

Figure 5:
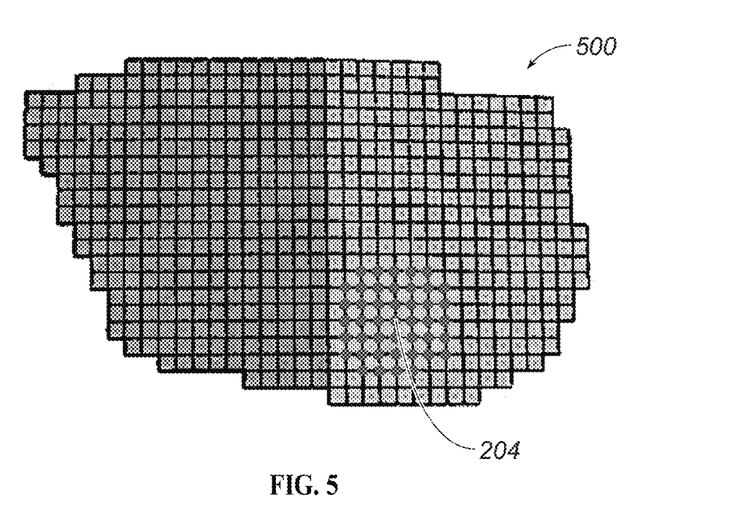
FIG. 5 is a partial cross-sectional view of FIG. 4 along 5-5.
Figure 6:
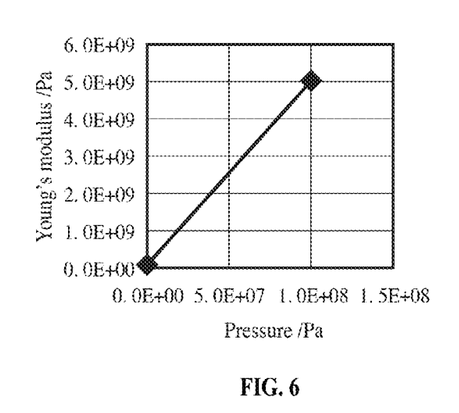
FIG. 6 is a graphical representation illustrating the stress dependency of Young's modulus for a material property of the reservoir in FIG. 5.
Figure 7:
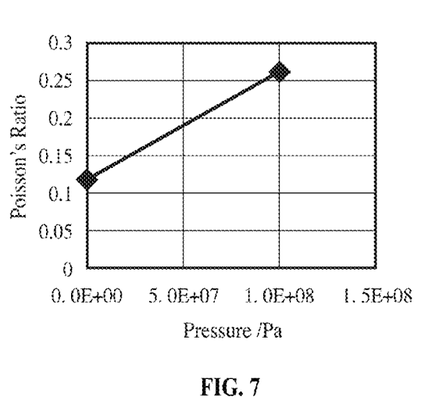
FIG. 7 is a graphical representation illustrating the stress dependency of Poisson's ratio for a material property of the reservoir in FIG. 5.

The compaction property of the chalk reservoir in FIG. 5 is simulated with a linear law of hardening. A graphical representation of the chalk skeleton variations of both Young's modulus and Poisson's ratio with pressure in effective stress space are illustrated in FIG. 6 and FIG. 7, respectively, for the chalk reservoir in FIG. 5.

The property of pressure dependency for chalk is realized by using an Abaqus™ subroutine in the calculation. This property could be found using various other well known methods and thus, is not limited to using the Abaqus™ subroutine. The porosity parameters of chalk are given the following values: initial void ratio R=0.5 and intrinsic permeability coefficient k=2 Darcy.

The elastic layer on the top of the field scale model 400 and the bottom layer material of the field scale model 400 are assumed to be elastic. Layer 2 material and layer 3 materials are assumed to be visco-elasto-plastic.

Loads and boundary conditions of the field scale model 400 must also be determined. The depth of overburden seawater is 100 m. The seawater produces a uniform pressure of 0.96 MPa on the overburden rock of the field scale model 400. The geostress field is balanced by the gravity field in the vertical direction, and components of lateral stress are given a value of 90% of the vertical component. The density values of the reservoir and the four model layers are given as:

$\rho_{reservoir}$=2100 kg/m³
$\rho_{clatic}$=2200 kg/m³
$\rho_{layer-2}$=2250 kg/m³
$\rho_{layerer-3}$=2250 kg/m³
$\rho_{bottom}$=2500 kg/m³

Figure 8:
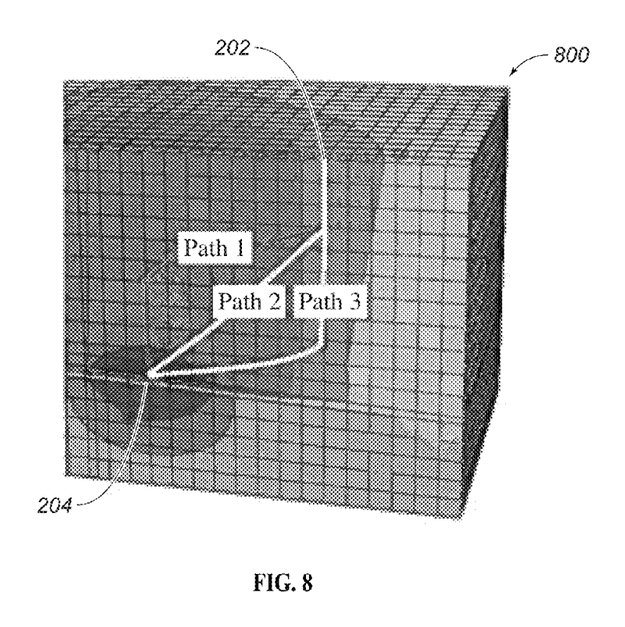
FIG. 8 is a sectional view of the field scale model in FIG. 4 illustrating three candidate well paths for consideration between end points 202 and 204 in FIG. 2.

The initial pore pressure within the reservoir is assumed to be 34 MPa. Two depletion scenarios thus, may be performed. First, a local pore pressure depletion of 34 MPa to 10 MPa may be utilized to simulate the subsidence caused by production from the well studied. Second, a field scale pore pressure depletion of 34 MPa to 20 MPa can be utilized to simulate the influence of nearby production wells as shown by the red dots in FIG. 5. Referring now to FIG. 8, a sectional view of the field scale model 400 in FIG. 4 further illustrates the results of step 302, which includes three candidate well paths for consideration between end points 202 and 204 in FIG. 2.

In step 304, the distributions of Formation Loading Potential are calculated using well known Finite Element methods for the entire field scale model 400 and are plotted along each candidate well path as illustrated in FIG. 8. Although the optimal wellbore trajectory can be determined by selecting the well path with the lowest peak value of Formation Loading Potential, it is necessary to consider the plotted distribution of Formation Loading Potential along the candidate well paths after pressure depletion in order to ensure the integrity of the casing along the wellbore trajectory during production operations.

Figure 9:
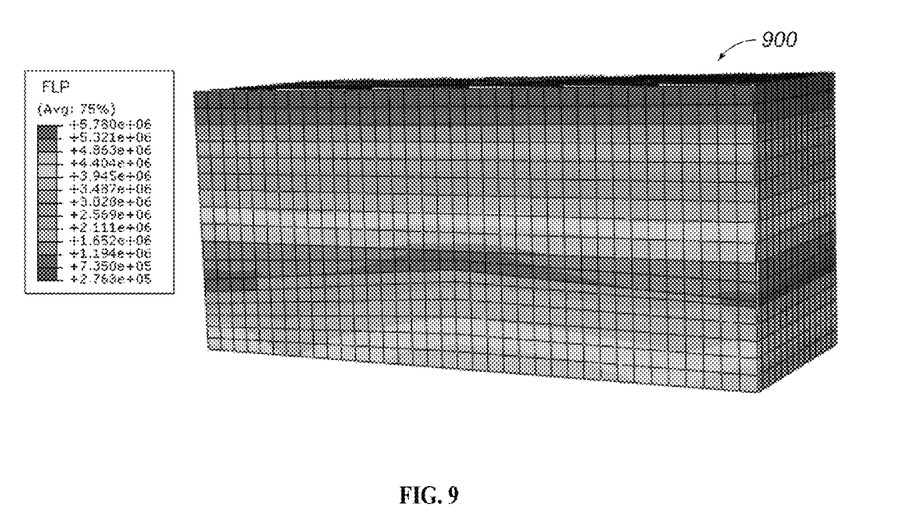
FIG. 9 illustrates the distribution of formation loading potential for the field scale model in FIG. 4.

Referring now to FIG. 9, the contour of Formation Loading Potential with an initial geostress field shows that Formation Loading Potential varies mainly with depth under this initial condition. The color variation represents values of Formation Loading Potential from 5.76 million to 0.2763 million. Peak values of Formation Loading Potential along the three candidate well paths are the same because the end of each well path is the deepest point. Thus, in this case, the wellbore trajectory optimization will be carried out mainly with reference to pore pressure depletion during the period of production. The Formation Loading Potential along the candidate with an undisturbed stress and pressure regime determines the driablity of the wellbore.

Figure 10:
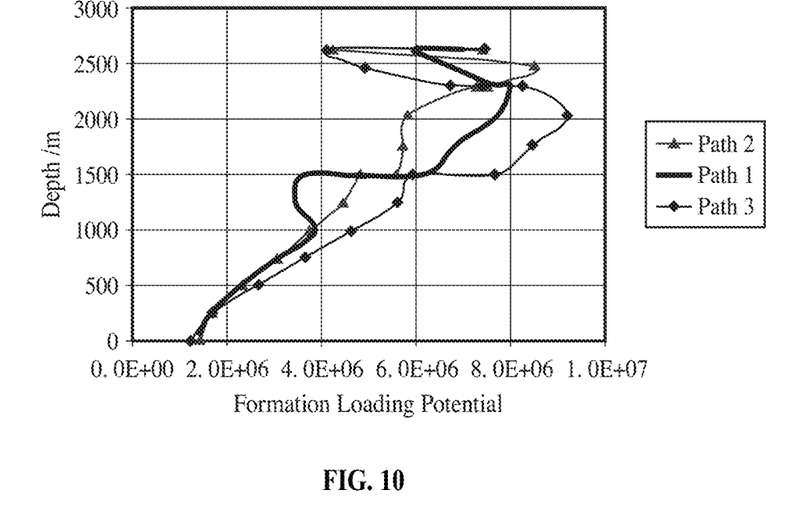
FIG. 10 is a graphical representation illustrating the plotted distribution of formation loading potential along each well path in FIG. 8 after pressure depletion near the wellbore.
Figure 11:
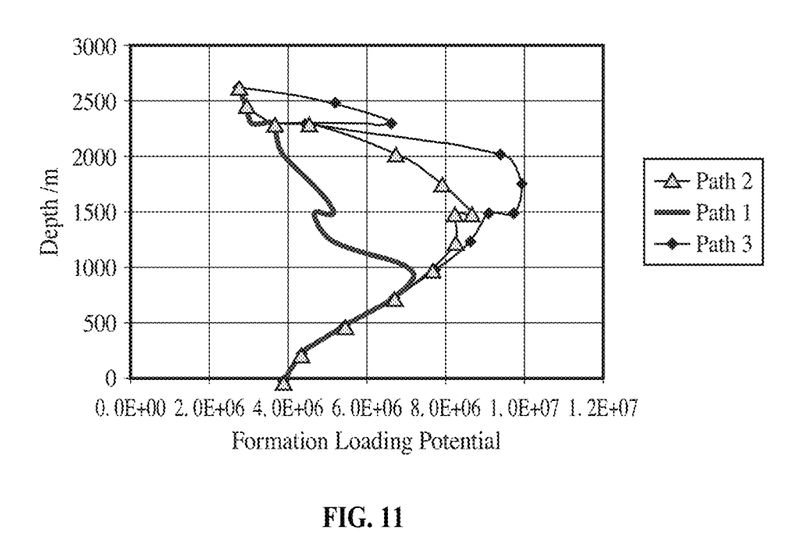
FIG. 11 is a graphical representation illustrating the plotted distribution of formation loading potential along each well path in FIG. 8 after pressure depletion of the entire field.

Referring now to FIGS. 10 and 11, the plotted results of step 304 for the three well paths shown in FIG. 8 are illustrated after pressure depletion near each well path (FIG. 10) and after pressure depletion of the entire production field (FIG. 11).

In step 306, the well path with the lowest peak value of Formation Loading Potential is selected. As illustrated in FIG. 10, the peak value of the Formation Loading Potential along Path-1 is the least of the three candidate well paths. Furthermore, FIG. 11 shows that this maximum value decreases as the pore pressure outside of the local region decreases. Because the Formation Loading Potential is a potential index of distortion deformation, the distortion deformation situation will be improved with the development of wellbores in the nearby field. These results confirm that Path-1 is the optimal path and will result in the minimum potential load on the casing. In order to estimate casing integrity along the optimal wellbore trajectory, a three-dimensional elaso-plastic finite element calculation can be performed on the wellbore interval containing the peak value of Formation Loading Potential for the selected well path instead of calculating along the whole selected well path.

In step 308, a primary submodel is calculated using well known finite element methods and the well path selected in step 306. The primary submodel includes the hydropressure effects at the wellbore surface and the wellbore interval containing the peak value of Formation Loading Potential for the selected well path (Path-1).

Figure 12:
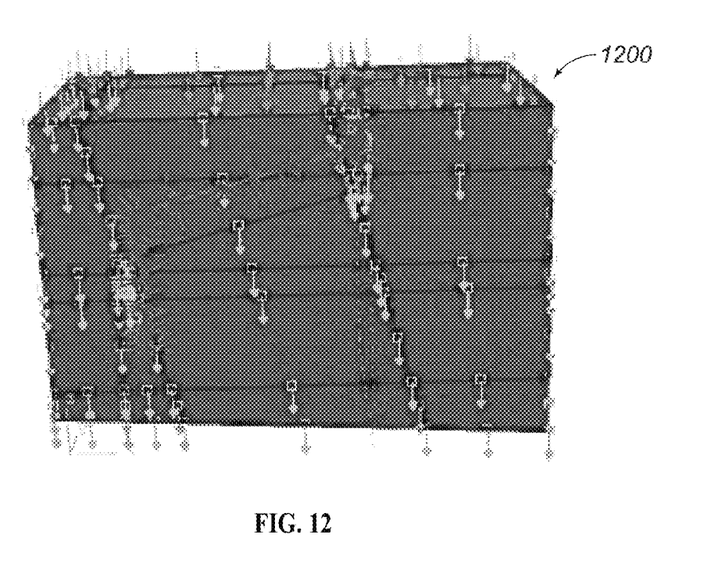
FIG. 12 is a primary submodel of the field scale model in FIG. 4 illustrating various loads on the primary submodel and an optimal well path selected in FIG. 8.

Referring to FIG. 12, a primary submodel 1200 is calculated using Path-1 as the well path selected in step 306. The region addressed by the primary submodel 1200 is much smaller than the field scale model 400. Only the upper-right corner in FIG. 4 is illustrated in the primary submodel 1200. Vertically, the depth of the primary submodel 1200 is adjusted to just above the reservoir. Field scale calculations provide the boundary conditions for the primary submodel 1200, which can accurately account for the influence of pressure depletion within the reservoir. For simplicity, the deformation and the porous flow are only calculated in the field scale model 400.

The loads on the primary submodel 1200 include the following: in-situ stress field generated by gravitational loading, vertical stress created by the seawater load, and hydraulic pressure applied at the wellbore surface. The wellbore (shown in red) is built into the primary submodel 1200 along Path-1 in FIG. 12.

The boundary conditions of the primary are set by applying the displacement constraints, obtained from numerical results of the field scale model 400, on the four lateral sides and bottom of the primary submodel 1200. Because the reservoir is not included in the primary submodel 1200, the calculation involves only visco-elasto-plastic static deformation. No porous fluid flow is considered.

Figure 13:
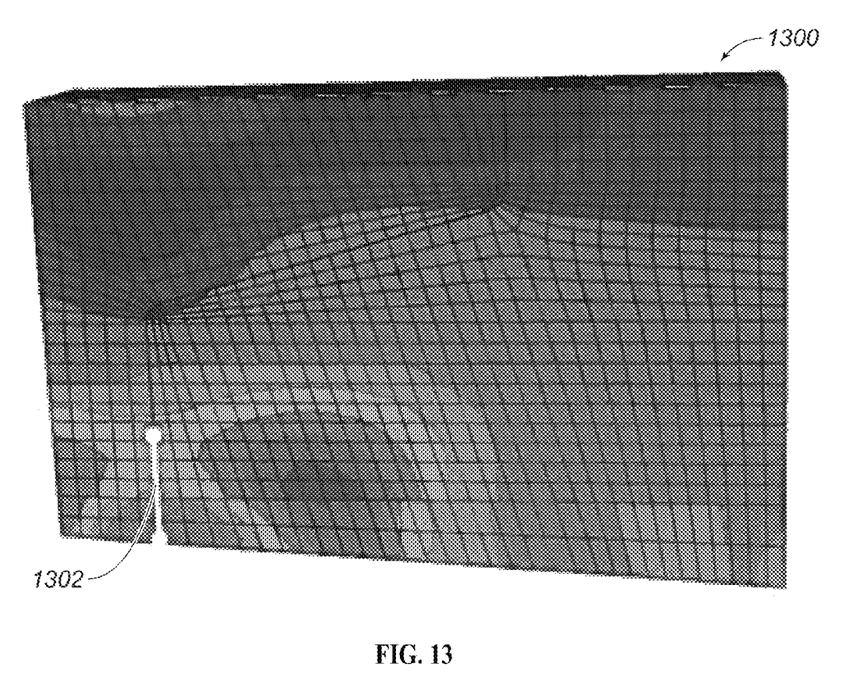
FIG. 13 is a sectional view of the primary submodel in FIG. 12 illustrating the contour distribution of formation loading potential for the optimal well path.
Figure 14:
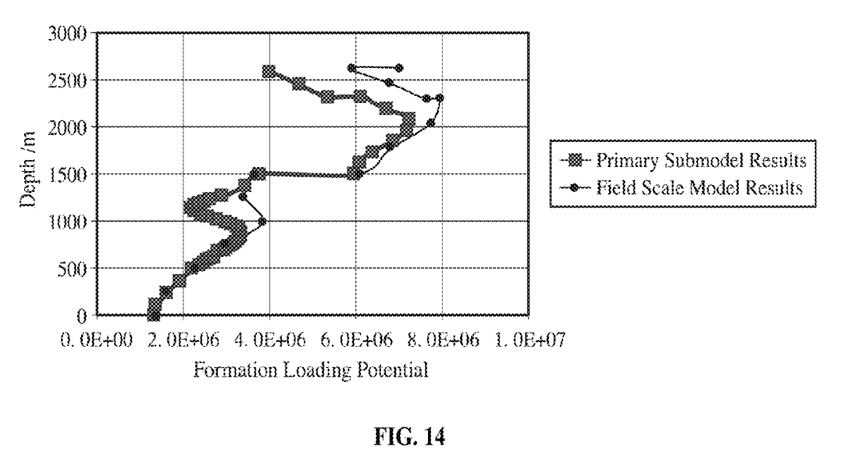
FIG. 14 is a graphical representation illustrating the plotted distribution of formation loading potential along the optimal well path for the field scale model in FIG. 4 and the primary submodel in FIG. 12.
Figure 15:
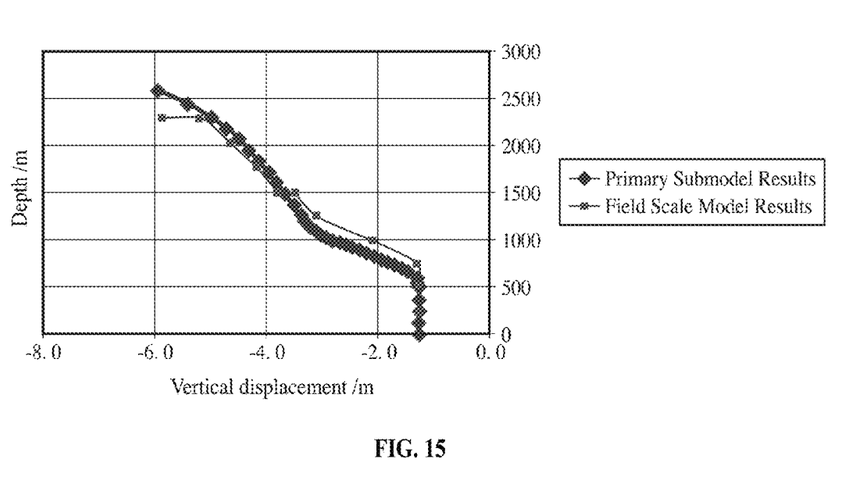
FIG. 15 is a graphical representation illustrating the plotted distribution of subsidence results along the optimal well path for the filed scale model in FIG. 4 and the primary submodel in FIG. 12.

Referring now to FIG. 13, the contour distribution of the Formation Loading Potential in a section 1300 of the primary submodel for Path-1 is illustrated. The color variation represents values of Formation Loading Potential from maximum to minimum. In FIG. 14, a comparison of the distribution of the Formation Loading Potential along Path-1 for the field scale model 400 and the primary submodel 1200 is illustrated. Values of the local result of Formation Loading Potential are lower than the ones obtained by the field scale model 400 at several points. For the purpose of further understanding the primary submodel results, a comparison between subsidence results obtained by the field scale model 400 and the primary submodel 1200 is illustrated in FIG. 15. The two sets of results are in close agreement, although the primary submodel results will be more accurate because of the higher resolution.

As shown in FIG. 13 and in FIG. 14, the greatest Formation Loading Potential occurs in a region 400 m above the reservoir along Path-1. This finding indicates that this location has the greatest potential for casing distortion.

In step 312, a secondary submodel of the wellbore interval containing the peak value of Formation Loading Potential for the well path selected in step 306 is calculated using well known finite element methods, which includes a predetermined tubular casing for lining the wellbore and an elasto-plastic prediction of the casing failure. This will ensure that tubular selected will endure the stresses convolved on the selected well-path.

The secondary submodel is used to make an elasto-plastic prediction of casing failure and deformation to further refine the mesh in the length of depth indicated by the white line 1302 in FIG. 13. Casing is set along the whole length of the selected well path (Path-1), which has an internal diameter of 0.254 m (10 in.) and a wall thickness of 0.015 m (approximately ⅗ inches). The casing material is assumed to be elasto-plastic with the following values of elastic and strength parameters:

$E = 2 \times 10^{11}$ Pa
$v = 0.3$
$\sigma_s = 8 \times 10^8$ Pa

Figure 16A:
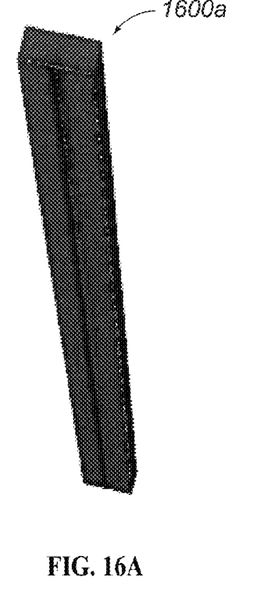
FIG. 16A is a secondary submodel of the field scale model in FIG. 4 illustrating the distribution of the formation loading potential within the formation (chalk reservoir).
Figure 16B:
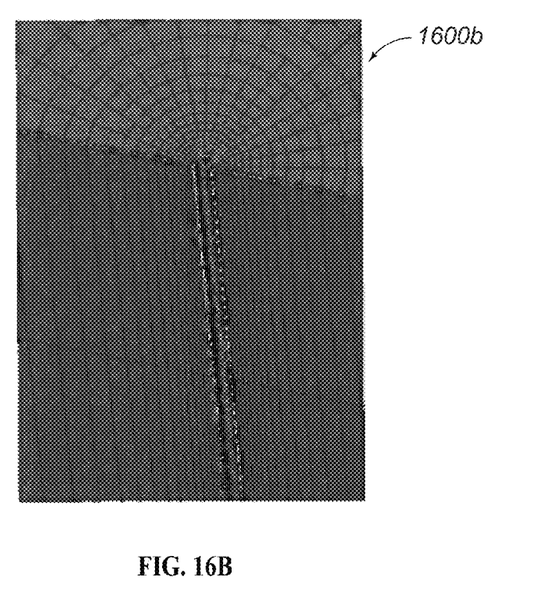
FIG. 16B is an enlarged area of the upper end of the secondary submodel in FIG. 16A.

In FIG. 16A, the results of the secondary submodel 1600a illustrate the distribution of the Formation Loading Potential within the formation (chalk reservoir). In FIG. 16B, an enlarged area (1600b) of the upper end of the secondary submodel 1600a is illustrated. The color variation represents equivalent plastic strain values from 0 to a positive value.

In step 316, the method 300 determines if the casing strength is acceptable. If the casing strength is acceptable, then the method 300 proceeds to step 318. If the casing strength is not acceptable then the method 300 proceeds to step 320. Whether the casing strength is acceptable depends on predetermined criteria such as, for example, a tolerable failure strain value for the casing. If, for example, the elasto-plastic prediction of the casing failure is greater than the tolerable failure strain value, the casing strength would not be acceptable.

Figure 17:
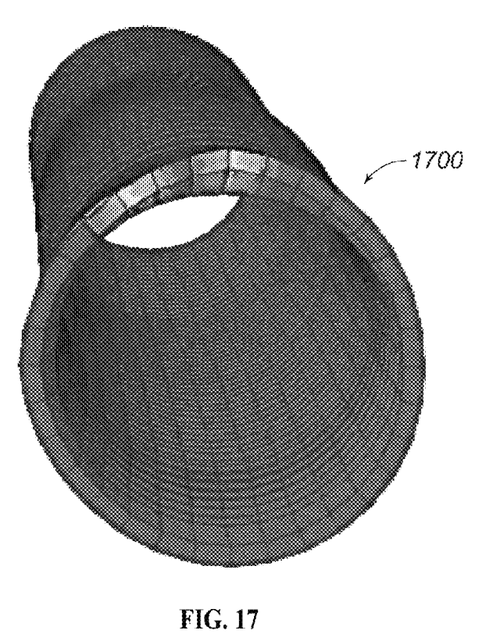
FIG. 17 is a graphically reproduced casing section illustrating the distribution of plastic strain within the casing section.

In step 318, the results of step 312 are displayed using the client interface and/or the video interface described in reference to FIG. 1, which include the predetermined tubular casing for lining the wellbore and an elasto-plastic prediction of the casing failure. In FIG. 17, for example, the results of step 312 are displayed for a predetermined tubular casing 1700 and illustrates the distribution of plastic strain within a graphically reproduced casing section 1700. Plastic deformation occurs at a small portion of casing at its right end (upper end as z-axis upward). The maximum value of plastic strain is 0.0095. Although this value is greater than a standard initial plastic strain value 0.002 for steel material, it is less than the tolerable failure strain value 3.5% (i.e. 0.035) for ductile casing steel. Because the field scale model (including geometry and loads) is not symmetrical, the deformation of casing is also not symmetrical. Thus, step 316 of the method 300 is satisfied because the amount of casing deformation is acceptable.

In step 320, the casing strength is increased by selecting a thicker casing or a stronger material and returns to step 312 until the casing strength is acceptable.

The optimization of a wellbore trajectory between a surface platform and reservoir intersection in the Ekofisk field has been performed. Individual analyses at a casing section scale and an analysis at the field scale were deliberately separated to overcome scale incompatibility and to improve calculation accuracy. Submodeling techniques were adopted to link the field and reservoir/casing scale challenges and to improve the overall effectiveness of the wellbore optimization. Subsidence was simulated at the field scale, whereas casing failure was calculated at a local level. Inelastic-visco deformation of the reservoir and porous fluid flow were calculated in the field scale modeling and linked, through submodeling, to the local level. An index of Formation Loading Potential within the formation/chalk under various loading conditions, such as pressure depletion and gravity, was used to derive a preferred well path candidate from three different candidates. This study confirms that an optimized wellbore trajectory can be achieved if Path-1 is selected because it results in the minimum distortion deformation of the casing.

The proposed numerical procedure provides an effective tool for selecting an optimized wellbore trajectory for efficient drilling and for maximized casing and wellbore stability. General economics will be improved with the reduction in non-productive time, reduced drilling cost and improved reservoir production as a result of the enhanced well stability.

While the present invention has been described in connection with presently preferred embodiments, it will be understood by those skilled in the art that it is not intended to limit the invention to those embodiments. Although the illustrated embodiments of the present invention relate to oil and gas wells, the present invention may be applied to any other type of well in other fields and disciplines. It is therefore, contemplated that various alternative embodiments and modifications may be made to the disclosed embodiments without departing from the spirit and scope of the invention defined by the appended claims and equivalents thereof.

The invention claimed is:
1. A computer-implemented method for optimization of a wellbore, which comprises:
  calculating a field scale model for multiple well paths in a production field using a computer processor, each well path representing a potential well bore trajectory;

calculating a Formation Loading Potential for the field scale model and plotting a distribution of the Formation Loading Potential along each well path;

selecting a well path having a lowest peak value of Formation Loading Potential, the selected well path representing an optimal wellbore trajectory for the wellbore;

calculating a primary submodel using the selected well path, the primary submodel comprising a wellbore interval containing the peak value of Formation Loading Potential for the selected well path;

calculating a secondary submodel of the wellbore interval, the secondary submodel comprising a predetermined casing for the wellbore and an elasto-plastic prediction of a casing failure value for the predetermined casing;

determining an optimal casing strength for the wellbore; and displaying the secondary submodel for a section of graphically reproduced predetermined casing;

drilling the wellbore along the selected well-path; and installing casing in the wellbore with the optimal casing strength.

2. The method of claim 1, wherein the predetermined casing comprises a predetermined length, diameter, thickness and material.

3. The method of claim 2, wherein determining the optimal casing strength for the wellbore comprises:
a) determining whether a casing strength for the predetermined casing is acceptable;
b) increasing the casing strength of the predetermined casing by selecting at least one of a thicker casing or a stronger material if the casing strength for the predetermined casing is unacceptable;
c) calculating another secondary submodel of the wellbore interval if the casing strength for the predetermined casing is unacceptable, the secondary submodel comprising another predetermined casing for the wellbore based on the selection of the at least one of the thicker casing or the stronger material and a value for an elasto-plastic prediction of a casing failure; and
d) repeating steps a-c until the casing strength is acceptable.

4. The method of claim 3, wherein the casing strength is acceptable if the value for the elasto-plastic prediction of the casing failure is less than a tolerable failure strain value for the predetermined casing or the another predetermined casing.

5. The method of claim 1, wherein the primary submodel further comprises hydropressure effects at a surface for the wellbore.

6. The method of claim 1, wherein the field scale model comprises a visco-elasto-plastic deformation analysis and a porous fluid flow related to pressure depletion of the production field.

7. The method of claim 6, wherein the distribution of the Formation Loading Potential along each well path is displayed after pressure depletion of the production field.

8. The method of claim 6, wherein the distribution of the Formation Loading Potential along each well path is displayed after pressure depletion near each well path.

9. The method of claim 1, wherein the display comprises a distribution of plastic strain within the graphically reproduced section of the predetermined casing.

10. A non-transitory program carrier device tangibly carrying computer executable instructions for optimization of a wellbore, the instructions being executable to implement:

calculating a field scale model for multiple well paths in a production field using a computer, each well path representing a potential well bore trajectory;

calculating a Formation Loading Potential for the field scale model and plotting a distribution of the Formation Loading Potential along each well path;

selecting a well path having a lowest peak value of Formation Loading Potential, the selected well path representing an optimal wellbore trajectory for the wellbore;

calculating a primary submodel using the selected well path, the primary submodel comprising a wellbore interval containing the peak value of Formation Loading Potential for the selected well path;

calculating a secondary submodel of the wellbore interval, the secondary submodel comprising a predetermined casing for the wellbore and an elasto-plastic prediction of a casing failure value for the predetermined casing;

determining an optimal casing strength for the wellbore;

displaying the secondary submodel for a section of graphically reproduced predetermined casing;

drilling the wellbore along the selected well-path; and installing casing in the wellbore with the optimal casing strength.

11. The program carrier device of claim 10, wherein the predetermined casing comprises a predetermined length, diameter, thickness and material.

12. The program carrier device of claim 11, wherein determining the optimal casing strength for the wellbore comprises:
a) determining whether a casing strength for the predetermined casing is acceptable;
b) increasing the casing strength of the predetermined casing by selecting at least one of a thicker casing or a stronger material if the casing strength for the predetermined casing is unacceptable;
c) calculating another secondary submodel of the wellbore interval if the casing strength for the predetermined casing is unacceptable, the secondary submodel comprising another predetermined casing for the wellbore based on the selection of the at least one of the thicker casing or the stronger material and a value for an elasto-plastic prediction of a casing failure; and
d) repeating steps a-c until the casing strength is acceptable.

13. The program carrier device of claim 12, wherein the casing strength is acceptable if the value for the elasto-plastic prediction of the casing failure is less than a tolerable failure strain value for the predetermined casing or the another predetermined casing.

14. The program carrier device of claim 10, wherein the primary submodel further comprises hydropressure effects at a surface for the wellbore.

15. The program carrier device of claim 10, wherein the field scale model comprises a visco-elasto-plastic deformation analysis and a porous fluid flow related to pressure depletion of the production field.

16. The program carrier device of claim 15, wherein the distribution of the Formation Loading Potential along each well path is displayed after pressure depletion of the production field.

17. The program carrier device of claim 15, wherein the distribution of the Formation Loading Potential along each well path is displayed after pressure depletion near each well path.

18. The program carrier device of claim 10, wherein the display comprises a distribution of plastic strain within the graphically reproduced section of the predetermined casing.

\* \* \* \* \*